United States Patent
Tsai et al.

(10) Patent No.: US 8,742,533 B2
(45) Date of Patent: Jun. 3, 2014

(54) CONSTANT CURRENT SEMICONDUCTOR DEVICE HAVING A SCHOTTKY BARRIER

(75) Inventors: Sheau-Feng Tsai, New Taipei (TW); Wen-Ping Huang, New Taipei (TW); Tzuu-Chi Hu, New Taipei (TW)

(73) Assignee: Formosa Microsemi Co., Ltd, New Taipei (TW)

( * ) Notice: Subject to any disclaimer, the term of this patent is extended or adjusted under 35 U.S.C. 154(b) by 121 days.

(21) Appl. No.: 13/219,838

(22) Filed: Aug. 29, 2011

(65) Prior Publication Data
US 2013/0049160 A1 Feb. 28, 2013

(51) Int. Cl.
*H01L 29/872* (2006.01)

(52) U.S. Cl.
USPC ............. 257/471; 257/54; 257/73; 257/267; 257/E29.338

(58) Field of Classification Search
USPC ............. 257/471, 201, E29.013, E29.043
See application file for complete search history.

(56) References Cited

U.S. PATENT DOCUMENTS

| | | | | |
|---|---|---|---|---|
| 7,880,763 B2 * | 2/2011 | Yutani | ........................... | 438/570 |
| 2007/0210335 A1 * | 9/2007 | Ikeda et al. | ................... | 257/201 |
| 2009/0315106 A1 * | 12/2009 | Hsieh | .............................. | 257/334 |
| 2010/0258899 A1 * | 10/2010 | Huang et al. | .................. | 257/484 |
| 2010/0317158 A1 * | 12/2010 | Yilmaz et al. | ................. | 438/571 |
| 2011/0133251 A1 * | 6/2011 | He | ................................ | 257/201 |

* cited by examiner

*Primary Examiner* — Marc Armand
*Assistant Examiner* — Quinton Brasfield

(57) ABSTRACT

This invention reveals a constant current semiconductor device of an N-type or a P-type epitaxial layer on a semi-insulating substrate, the device is treated by using a Schottky barrier to cut off current in conduction channels under certain bias and to provide constant current within cut-off voltage and breakdown voltage region between Schottky barrier section/ohmic contact section as the first electrode and the other ohmic contact section as the second electrode respectively, and has excellent characteristics as lower cut-off voltage (Vkp) than bipolar devices and easily gets higher constant current (Ip) by integrating several constant current units.

7 Claims, 3 Drawing Sheets

CONSTANT CURRENT SEMICONDUCTOR DEVICE HAVING A SCHOTTKY BARRIER

BACKGROUND OF THE INVENTION

1. Field of the Invention

The present invention relates to a technique of semiconductor, and especially to a constant current semiconductor device having a Schottky Barrier made by using the principle of metal/semiconductor contacting, the structure/characteristic of the constant semiconductor is different from that of a Schottky diode.

2. Description of the Prior Art

A PN diode made of semiconductor basic material is formed according to a basic principle of combining a P type and an N type semiconductor basic material by a semiconductor diffusing technique etc. and then packing the combined semiconductor basic materials, and having an external circuit connected with electrodes. More often seen case in using is taking advantage of the character that electric current is easier to flow from the P type are to the N type area but less easier to flow in a contrary direction, in order to get a rectifier for use. And more, a Schottky diode is used for electric rectifying by taking advantage that a Schottky Barrier made by metal/semiconductor combining can also have the character of letting passing of electric current in one way and not allowing passing of electric current in the other way. Particularly, the PN diode/the Schottky diode are used in rectifying an alternate circuit power source into a direct circuit power source, to be provided for using by electronic circuits of a normal electric product.

Except that the above PN diode/Schottky diode can be used as rectifiers, according to different functions and material characters of various diodes, the diodes can include Zener diodes, switching diodes, photo diodes etc. Further, an LED (light emitting diode) having the characters of saving energy, being light, thin and small had been widely used on various electronic products since a very long time ago. After development of the technique of hi-brightness LEDs, the LEDs show their ability of taking the places of the conventional illuminative light emitting devices such as in those devices for industrial use, house illumination, traffic road use etc., we can see LEDs in use.

For the above mentioned LEDs and general electric circuit designing, we often see constant voltage power source for which LEDs' arrays are used, so long the output voltage of the circuit of the power source meets the rated voltage of the LED array, the LED array can be driven. However, various LED arrays can be of different amount and of different voltage values being due to different places they are used in, outputting of overly high voltage to the circuit of the power source must be limited according to the amount of the LEDs and their matched series current limiting resistances, this will induce power loss; moreover, when part of the LEDs in the LED arrays are damaged, the entire voltage will be lowered, electric current will be increased to render other LEDs to be damaged one by one; additionally, the constant voltage power source may frequently have the problem of twinkling in use because of the unstable voltage.

In order to overcome the above problem, theoretically, to adapt a constant current power source control mode will be better than a constant voltage power source control mode, however, the constant current power source control mode practiced presently uses the devices composed of complicated composited integrated circuits of very high cost; if the devices are made in a mode of using bipolar constant current and taking a plane technique of complicated PN interface transistors, not only their rate of superiorities are bad to render impossible of mass production, but also larger driving electric currents are not easy to be created.

In view of these, the inventor of the present invention provided a constant current semiconductor device having a Schottky Barrier to eliminate the defects of the prior techniques after having studied and having practical experience in the technical field of semiconductor for years.

SUMMARY OF THE INVENTION

The object of the present invention is to provide a constant current semiconductor device having a Schottky Barrier, the semiconductor device has the characters of a Schottky Barrier and constant current, it not only has lower activating voltage, but also it is easier to separate a plurality of individual semiconductor devices during the process of manufacturing, and these individual semiconductor devices are integrated to form a larger constant current semiconductor device or to design and get constant current semiconductor device arrays for use; the structure/characteristic of the semiconductor device is different from that of a traditional Schottky diode.

In order to achieve the above stated object, the constant current semiconductor device having a Schottky Barrier of the present invention is grown on the surface of an N type or a P type semiconductor epitaxial layer of a semi-insulating substrate and is provided with a first metallic electrode terminal and a second metallic electrode terminal for electric connecting, wherein a first Ohmic contact section and a Schottky contact section are included between the first metallic electrode terminal and the aforesaid epitaxial layer, a second Ohmic contact section is located between the second metallic electrode terminal and the epitaxial layer, and an area of the Schottky contact section between the first Ohmic contact section and the second Ohmic contact section is separated from the second Ohmic contact section, so that the area at the Schottky contact section of the semiconductor device has the character of having lower activating voltage of the Schottky Barrier, and has the function of constant current by the design of the thickness/material quality of the epitaxial layer and the distance between the first metallic electrode terminal and the second metallic electrode terminal, the structure/characteristic of the semiconductor device is different from that of a traditional Schottky diode.

The second mode of practicing of the present invention has the surface of the N type or P type semiconductor epitaxial layer grown on a semi-insulating substrate provided with a first metallic electrode terminal and a second metallic electrode terminal separated from each other and provided for electric connecting, further, the epitaxial layer is provided between the first metallic electrode terminal and the second metallic electrode terminal with a recessed and stepped mesa; wherein the area between the first metallic electrode terminal and the epitaxial layer is the first Ohmic contact section, and the first metallic electrode terminal is extended along the surface of the epitaxial layer to the stepped mesa; while the area between the first metallic electrode terminal and the stepped mesa is the Schottky contact section; the area between the second metallic electrode terminal and the epitaxial layer is the second Ohmic contact section, and the second Ohmic contact section is separated from the Schottky contact section, so that the area at the Schottky contact section of the semiconductor device has the character of having lower activating voltage of the Schottky Barrier, and has the function of constant current by the design of the thickness, material quality of the epitaxial layer and the depth or width of the stepped mesa, the structure/characteristic of the semiconductor device is different from that of a traditional Schottky diode.

In practicing of the above constant current semiconductor device, the first metallic electrode terminal and the second metallic electrode terminal can be used for electric connecting, so that in the subsequent process, the semiconductor device can be fixed on a supporting stand, the first metallic electrode terminal and the second metallic electrode terminal are electrically connected with the pins on the supporting stand, and after packing the flip-chip and a process of segmentation, a constant current diode can be formed. Certainly, if the first and the second metallic electrode terminals are made of appropriate materials, directly exposing them outside to use them as SMD (surface mounting device) pins can be another mode of practicing.

Moreover, if a plurality of constant current semiconductor devices having Schottky Barriers as said above are directly isolated one from another on a chip of a large area, an integrated constant current semiconductor device applicable for larger driving electric current can be obtained by using a lighting shield and designing with a photo technique provided in the process of manufacturing. And alternatively, a plurality of constant current semiconductor devices having Schottky Barriers can be designed by using supporting stands, subsequently they can be formed constant current semiconductor device arrays also through flip-chip packing, not only the above manufacturing process can have the advantage of saving working hours and being easy for design and manufacturing, and they can have heat sunk on the surfaces of the structure produced, in this way, they particularly can have excellent heat scattering ability, and can have much wider applicable range.

The followings are descriptions of some other particular modes of practicing of the present invention:

In the process of manufacturing, for the convenience of making electric connecting and fixing of the first and the second metallic electrode terminals with and to the pins of the supporting stand, the surfaces of the first and the second metallic electrode terminals can be provided each with a soldering ball in practicing. If the first and the second metallic electrode terminals are exposed directly outside to be used as SMD (surface mounting device) pins, the soldering balls can be used as solders to be welded to a PC board or some other base board in an SMT (surface mounting technology).

For the purpose of increasing the superiority of products, the first and the second metallic electrode terminals can be provided therebetween with an insulating protective layer, in order to assure the insulation state between the first and the second metallic electrode terminals.

And for the purpose of getting the effect of the above mentioned larger constant current semiconductor device arrays to make a plurality of constant current semiconductor devices having Schottky Barriers on a chip be isolated one from another, the two lateral sides of the epitaxial layer can be treated with a diffusion process to form an isolation layer.

In the process of manufacturing, in order that the plurality of constant current semiconductor devices having Schottky Barriers on a chip can be treated with the subsequent process of segmentation, the two lateral sides of the epitaxial layer can be treated with the mesa etching process to form two lateral isolation grooves, and glass or a passive protecting layer formed of material such as oxidized layers etc. are filled in the two lateral isolation grooves.

In practicing, forming of the stepped mesa can be progressed at the same time as or separately from the mesa etching processing, while forming of the passive protecting layer can be progressed at the same time as or separately from the isolation layer.

As compared with the prior art, the constant current semiconductor device having a Schottky Barrier of the present invention has in addition to a lower activating voltage of the Schottky Barrier and the character of having electric current, the structure/characteristic of each individual semiconductor device not only is different from that of a Schottky diode, but also a plurality of individual semiconductor devices are easier to be separated during the process of manufacturing, and these individual semiconductor devices are integrated to form a larger constant current semiconductor device applicable for larger driving electric current, hence the manufacturing process can have the advantages of saving working hours and being easy for design and manufacturing; and they can have heat sunk on the surfaces of the structure produced in use, in this way, they particularly can have excellent heat scattering ability, and can have much wider applicable range.

The present invention will be apparent in its mode of practicing after reading the detailed description of the preferred embodiment thereof in reference to the accompanying drawings.

DETAILED DESCRIPTION OF THE PREFERRED EMBODIMENT

Figure 1:
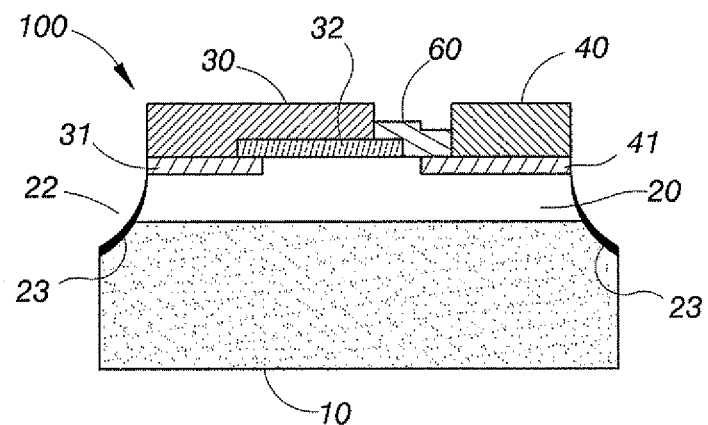
FIG. 1 is a sectional schematic side view showing the structure of the first embodiment of the present invention.

As shown in FIG. 1, a constant current semiconductor device 100 having a Schottky Barrier is grown on the surface of an N type or a P type semiconductor epitaxial layer 20 of a semi-insulating substrate 10 and is provided with a first metallic electrode terminal 30 and a second metallic electrode terminal 40 for electric connecting, wherein a first Ohmic contact section 31 and a Schottky contact section 32 are included between the first metallic electrode terminal 30 and the aforesaid epitaxial layer 20, the area between the second metallic electrode terminal 40 and the epitaxial layer 20 is a second Ohmic contact section 41, the Schottky contact section 32 is located between the first Ohmic contact section 31 and the second Ohmic contact section 41, and the Schottky contact section 32 is separated from the second Ohmic contact section 41, so that the area of the constant current semiconductor device 100 at the Schottky contact section 32 has the character of having lower activating voltage of the Schottky Barrier, the function of constant current is provided by the design of the thickness/material quality of the epitaxial layer 20 and the distance between the first metallic electrode terminal 30 and the second metallic electrode terminal 40, the structure/characteristic of the semiconductor device is different from that of a traditional Schottky diode.

Figure 2:
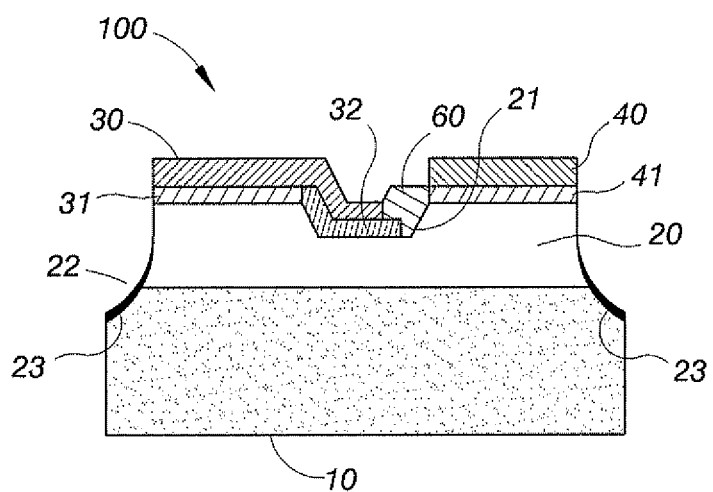
FIG. 2 is a sectional schematic side view showing the structure of the second embodiment of the present invention.

As shown in FIG. 2, in the second mode of practicing of the present invention, the surface of the N type or P type semiconductor epitaxial layer 20 grown on the semi-insulating substrate 10 is provided with a first metallic electrode terminal 30 and a second metallic electrode terminal 40 for electric connecting, and the epitaxial layer 20 is provided between the first metallic electrode terminal 30 and the second metallic electrode terminal 40 with a recessed and stepped mesa 21; wherein the area between the first metallic electrode terminal 30 and the epitaxial layer 20 is the first Ohmic contact section 31, and the first metallic electrode terminal 30 is extended along the surface of the epitaxial layer 20 to the stepped mesa 21, while the area between the first metallic electrode terminal 30 and the stepped mesa 21 is a Schottky contact section 32; the area between the second metallic electrode terminal 40 and the epitaxial layer 20 is the second Ohmic contact section 41, and the second Ohmic contact section 41 is separated from the Schottky contact section 32, so that the area at the Schottky contact section 32 of the semiconductor device 100 has the character of having lower activating voltage of the Schottky Barrier, and has the function of constant current by the design of the thickness, material quality of the epitaxial layer 20 and the depth or width of the stepped mesa 21, the structure/characteristic of the semiconductor device 100 is different from that of a traditional Schottky diode.

Figure 3:
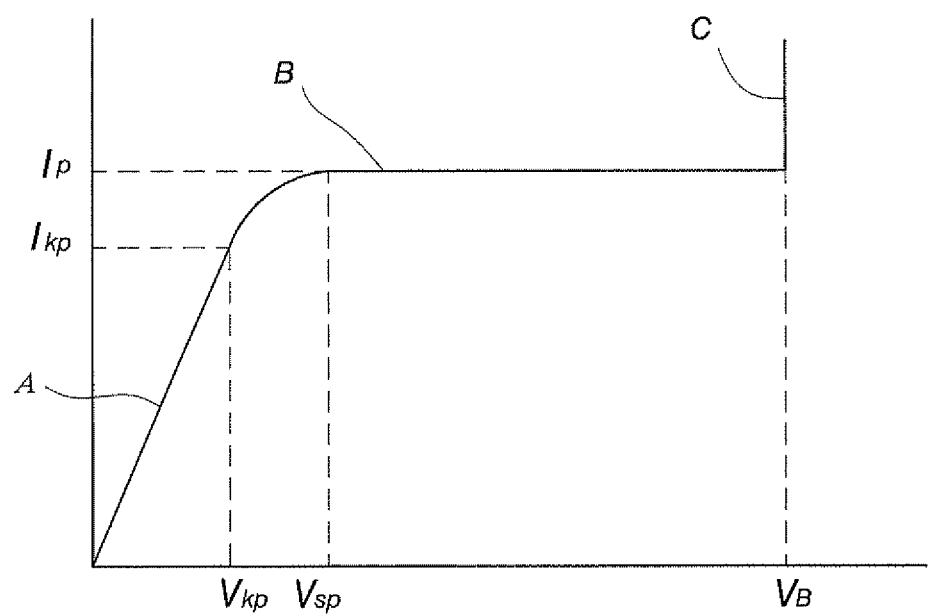
FIG. 3 is a view showing a characteristic curve of the present invention in practicing the Schottky Barrier and the constant current.

The character of the semiconductor device 100 having lower activating voltage of the Schottky Barrier and having the function of constant current is shown by a curve in FIG. 3:

When the semiconductor device 100 is in a state of having a lower voltage, two electrodes in the section A on the drawing have the characters of electric resistance; by virtue that control of the Schottky voltage can change the depletion layer of the Schottky Barrier, when the voltage reaches the $V_{KP}$, the linear resistance character is changed to cut-off the current of the electric conducting channel to get the saturated constant current $I_P$ (shown by the section B in the drawing); at this time, by the above stated design of the thickness, material quality of the epitaxial layer 20 and the distance between the first metallic electrode terminal 30 and the second metallic electrode terminal 40 or the depth or width of the stepped mesa 21, the characteristic curve can be controlled to follow raising of the voltage ($V_{SP}$~$V_B$) to get in the breakdown section C, in this way, by designing of Schottky Barrier, the effect of the aforesaid lower activating voltage ($V_{KP}$) and constant current ($I_P$) can be attained.

And more, the above stated semiconductor device 100 having lower activating voltage of the Schottky Barrier surely can achieve the effect through an experiment, for example: the above mentioned semi-insulating substrate 10 is given with a resistance coefficient 20 Ω-cm, the epitaxial layer 20 is given with about 20 Ω-cm and has a thickness of 10 μm, the width of the Schottky Barrier is about 2 μm, the size of the semiconductor device 100 is about 300~600 μm×300~600 μm, then a product of constant current semiconductor with a voltage between 10V~100V and a current of 20 mA can be made.

In practicing of the above constant current semiconductor device 100, the first metallic electrode terminal 30 and the second metallic electrode terminal 40 can be used for electric connecting, so that in the subsequent process, the semiconductor device 100 can be fixed on a supporting stand, the first metallic electrode terminal 30 and the second metallic electrode terminal 40 are electrically connected with the pins on the supporting stand, and after packing a flip-chip and a process of segmentation, a constant current diode can be formed. Certainly, if the first and the second metallic electrode terminals 30, 40 are made of appropriate materials, directly exposing them outside to use them as SMD (surface mounting device) pins can be another mode of practicing. The supporting stand, pins, flip-chip, the process of segmentation and the SMD are all conventional techniques, hence no further narration is provided here.

Moreover, if a plurality of constant current semiconductor devices 100 having Schottky Barriers as said above are directly isolated one from another on a chip of a large area, an integrated constant current semiconductor device 100 applicable for larger driving electric current can be obtained by using a lighting shield and designing with a photo technique provided in the process of manufacturing. And alternatively, a plurality of constant current semiconductor devices 100 having Schottky Barriers can be designed by using supporting stands, subsequently they can be formed constant current semiconductor device arrays also through flip-chip packing, not only the manufacturing process can have the advantage of saving working hours and being easy for design and manufacturing, and they can have heat sunk on the surfaces of the structure produced, in this way, they particularly can have excellent heat scattering ability, and can have much wider applicable range.

Figure 4:
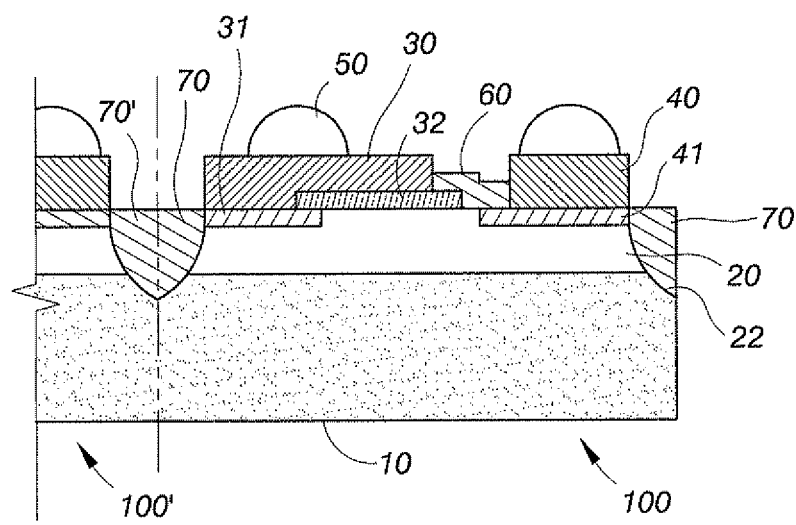
FIG. 4 is a sectional schematic side view showing the structure of the first embodiment of the present invention in some other mode of practicing.
Figure 5:
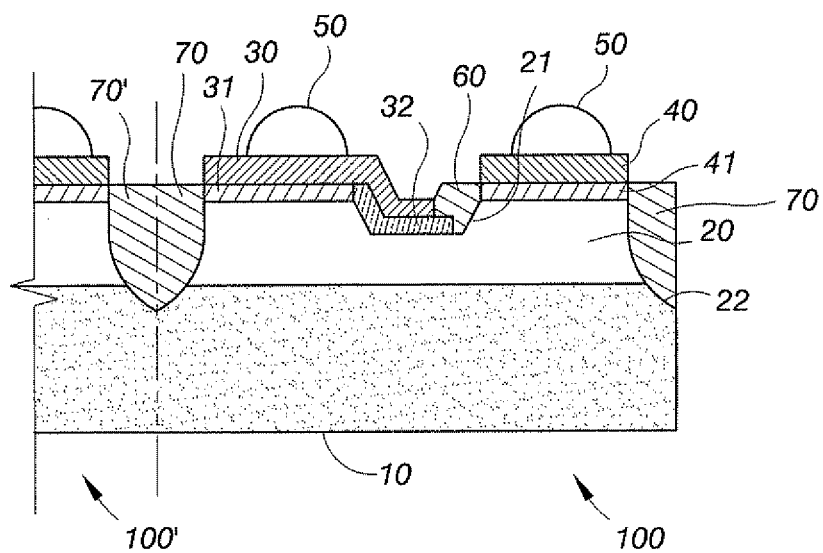
FIG. 5 is a sectional schematic side view showing the structure of the second embodiment of the present invention in some other mode of practicing.

The followings are descriptions of some other particular modes of practicing of the present invention:

As shown in FIGS. 4, 5, for the convenience of fixing the semiconductor device 100 on the above mentioned supporting stand, the surfaces of the first and the second metallic electrode terminals 30, 40 can be provided each with a soldering ball 50 in practicing, so that the semiconductor device 100 can be fixed to the pins on the supporting stand by welding of the soldering ball 50 and make electric connecting. If the first and the second metallic electrode terminals 30, 40 are exposed directly outside to be used as SMD (surface mounting device) pins, the soldering balls 50 can be used as solders to be welded to a PC board or some other substrate in an SMT (surface mounting technology).

For the purpose of increasing the superiority of products, the first and the second metallic electrode terminals 30, 40 can be provided therebetween with an insulating protective layer 60, in order to assure the insulation state between the first and the second metallic electrode terminals 30, 40.

And in the process of manufacturing, for the purpose of getting the effect of the above mentioned larger constant current semiconductor device arrays to make a plurality of constant current semiconductor devices 100 having Schottky Barriers on a chip be isolated one from another, the two lateral sides of the epitaxial layer 20 can be treated with a diffusion process to form an isolation layer 70 between two epitaxial layers 20, 20' of two mutually neighboring semiconductor devices 100, 100', the isolation layer 70 can thus makes the two mutually neighboring semiconductor devices 100, 100' be separated from each other, so that the above mentioned larger constant semiconductor devices 100 formed by integrating and applicable for larger driving electric current can be obtained, and through subsequent process of manufacturing, large constant current devices and large constant current device arrays applicable for large electric current can be made.

As shown in FIGS. 1, 2, in the process of manufacturing, in order that the plurality of constant current semiconductor devices 100 having Schottky Barriers on a chip can be treated with the subsequent process of segmentation, the two lateral sides of the epitaxial layer 20 can be treated with the mesa etching process to form two lateral isolation grooves 22, and glass or a passive protecting layer 23 formed of material such as oxidized layers etc. is filled in the two lateral isolation grooves 22; thus a passive protecting effect can be formed on the two lateral sides of each constant current semiconductor device 100 after a segmentation process.

In practicing, forming of the stepped mesa 21 can be progressed at the same time as or separately from the mesa etching processing, while forming of the passive protecting layer 23 can be progressed at the same time as or separately from the above mentioned insulating protective layer 60, in order to save working hours and flow process of manufacturing.

The names of the members stated above are only for the convenience of describing the technical content of the present invention, and not for giving any limitation to the scope of the present invention. It will be apparent to those skilled in this art that various equivalent modifications or changes without departing from the spirit and the space mode of this invention can be made to the elements of the present invention and also fall within the scope of the appended claims.

What is claimed is:

1. A constant current semiconductor device having a Schottky Barrier, comprising an N type or a P type semiconductor epitaxial layer of a semi-insulating substrate, a first metallic electrode terminal and a second metallic electrode terminal that are both disposed over a top surface of the epitaxial layer, wherein a first Ohmic contact section and a Schottky contact section are disposed between said first metallic electrode terminal and said epitaxial layer, the first metallic electrode directly contacting a first portion of the first Ohmic contact section and directly contacting at least a portion of the Schottky contact section, a second portion of the first Ohmic contact section disposed under and directly contacting the Schottky contact section, a second Ohmic contact section is disposed between said second metallic electrode terminal and said epitaxial layer, and an area of the Schottky contact section between said first Ohmic contact section and said second Ohmic contact section is separated from said second Ohmic contact section.

2. The constant current semiconductor device having a Schottky Barrier as in claim 1, wherein top surfaces of said first metallic electrode terminal and said second metallic electrode terminal further are provided each with a soldering ball.

3. The constant current semiconductor device having a Schottky Barrier as in claim 1, wherein said first metallic electrode terminal and said second metallic electrode terminal further are provided therebetween with an insulating protective layer.

4. The constant current semiconductor device having a Schottky Barrier as in claim 1, wherein two lateral sides of said epitaxial layer are each provided with an isolation layer such that two mutually neighboring semiconductor devices are substantially isolated from each other.

5. The constant current semiconductor device having a Schottky Barrier as in claim 4, wherein said isolation layer is formed by a diffusion process.

6. The constant current semiconductor device having a Schottky Barrier as in claim 1, wherein two lateral sides of said epitaxial layer are each provided with a lateral isolation groove.

7. The constant current semiconductor device having a Schottky Barrier as in claim 6, wherein said isolation grooves are formed by a mesa etching process.

\* \* \* \* \*